(12) United States Patent
Luan

(10) Patent No.: US 9,502,381 B2
(45) Date of Patent: Nov. 22, 2016

(54) SEMICONDUCTOR DEVICE, SEMICONDUCTOR PACKAGE, AND METHOD FOR MANUFACTURING SEMICONDUCTOR DEVICE

(71) Applicant: STMICROELECTRONICS PTE LTD, Singapore (SG)

(72) Inventor: Jing-En Luan, Shenzhen (CN)

(73) Assignee: STMICROELECTRONICS PTE LTD, Singapore (SG)

( * ) Notice: Subject to any disclaimer, the term of this patent is extended or adjusted under 35 U.S.C. 154(b) by 0 days.

(21) Appl. No.: 14/817,502

(22) Filed: Aug. 4, 2015

(65) Prior Publication Data

US 2016/0190097 A1 Jun. 30, 2016

(30) Foreign Application Priority Data

Dec. 31, 2014 (CN) .......................... 2014 1 0854553

(51) Int. Cl.
| | |
|---|---|
| *H01L 21/48* | (2006.01) |
| *H01L 21/56* | (2006.01) |
| *H01L 21/78* | (2006.01) |
| *H01L 23/00* | (2006.01) |
| *H01L 23/31* | (2006.01) |
| *H01L 23/498* | (2006.01) |
| *H01L 25/00* | (2006.01) |
| *H01L 25/065* | (2006.01) |

(52) U.S. Cl.
CPC ....... *H01L 25/0655* (2013.01); *H01L 21/4853* (2013.01); *H01L 21/561* (2013.01); *H01L 21/565* (2013.01); *H01L 21/78* (2013.01); *H01L 23/3114* (2013.01); *H01L 23/49838* (2013.01); *H01L 24/05* (2013.01); *H01L 24/29* (2013.01); *H01L 24/45* (2013.01); *H01L 24/73* (2013.01); *H01L 24/83* (2013.01); *H01L 24/85* (2013.01); *H01L 24/92* (2013.01); *H01L 24/96* (2013.01); *H01L 25/50* (2013.01); *H01L 2224/04042* (2013.01); *H01L 2224/0556* (2013.01); *H01L 2224/29026* (2013.01); *H01L 2224/32225* (2013.01); *H01L 2224/48101* (2013.01); *H01L 2224/48247* (2013.01); *H01L 2224/73265* (2013.01); *H01L 2224/838* (2013.01); *H01L 2224/92147* (2013.01)

(58) Field of Classification Search
CPC ....... H01L 24/83; H01L 24/86; H01L 24/26; H01L 24/33; H01L 24/05; H01L 24/73; H01L 24/96; H01L 25/50; H01L 2224/32225; H01L 2224/13186; H01L 2224/16225; H01L 2224/2929; H01L 2924/14
See application file for complete search history.

(56) References Cited

U.S. PATENT DOCUMENTS

| | | | | |
|---|---|---|---|---|
| 6,734,569 B2* | 5/2004 | Appelt | ..................... | H01L 24/49 156/279 |
| 2014/0284806 A1* | 9/2014 | Luo | ................... | H01L 23/49513 257/773 |
| 2015/0125646 A1* | 5/2015 | Tournilhac | ............... | C09K 5/14 428/36.92 |

* cited by examiner

*Primary Examiner* — Jasmine Clark
(74) *Attorney, Agent, or Firm* — Seed IP Law Group LLP

(57) ABSTRACT

Embodiments of the present disclosure provide a semiconductor device, a semiconductor package, and a method for manufacturing a semiconductor device. The semiconductor device comprises: a semiconductor die; an electrical isolation layer formed on a surface of the semiconductor die; a substrate; and a non-conductive adhesive layer disposed between the electrical isolation layer and the substrate, so as to adhere the electrical isolation layer to the substrate.

10 Claims, 6 Drawing Sheets

SEMICONDUCTOR DEVICE, SEMICONDUCTOR PACKAGE, AND METHOD FOR MANUFACTURING SEMICONDUCTOR DEVICE

BACKGROUND

Technical Field

Various embodiments of the present disclosure relate to the field of semiconductor technologies, and in particular relate to a semiconductor device, a semiconductor package, and a method for manufacturing a semiconductor device.

Description of the Related Art

In some semiconductor devices in the prior art, an adhesive material is needed to mount a semiconductor die to a substrate. FIG. 1 shows a semiconductor package 100 including such semiconductor device 1000 according to the prior art. As shown in FIG. 1, the semiconductor package 100 comprises a semiconductor device 1000 and a molding compound 9 for encapsulating the semiconductor device 1000. In the semiconductor device 1000, a first semiconductor die 1 is adhered to a substrate 6 via a die attach film 3 (DAF) and an adhesive glue 4, and a second semiconductor die 2 is adhered to the substrate 6 via an electrical conductive adhesive layer 5. Besides, the first semiconductor die 1 and the second semiconductor die 2 are also connected to a lead 8 via a bonding wire 7.

As shown in FIG. 1, the DAF 3 and the adhesive glue 4 are used to adhere the first semiconductor device die 1 to the substrate 6 and to provide electrical isolation between the first semiconductor die 1 and the substrate 6. However, such manner of adhesion between the first semiconductor die 1 and the substrate 6 has problems in various aspects. For example, due to the poor reliability of the electric isolation provided by the DAF 3 and the adhesive glue 4, there is a risk that a short circuit is likely to occur between the first semiconductor die 1 and the substrate 6. Besides, because the DAF 3 and the adhesive glue 4 are all soft materials, resonance likely occurs when mounting the bonding wire 7 using thermal ultrasonic techniques, resulting in a poor connection of the bonding wire 7 to the first semiconductor die 1 and the lead 8.

BRIEF SUMMARY

Objectives of the present disclosure include providing a semiconductor, a semiconductor package, and a method for manufacturing a semiconductor device, so as to at least partially solve the above problems in the prior art.

According to one aspect of the present disclosure, there is provided a semiconductor device, comprising: a semiconductor die; an electrical isolation layer formed on a surface of the semiconductor die; a substrate; and a non-conductive adhesive layer disposed between the electrical isolation layer and the substrate, so as to adhere the electrical isolation layer to the substrate.

According to an exemplary embodiment of the present disclosure, the semiconductor die comprises a bonding pad, the bonding pad being disposed at another surface of the semiconductor die opposite to the surface.

According to an exemplary embodiment of the present disclosure, the semiconductor device further comprises a lead, the lead being connected to the bonding pad using a bonding wire.

According to an exemplary embodiment of the present disclosure, the semiconductor device further comprises: a further semiconductor die; and a conductive adhesive layer configured to adhere the further semiconductor die to the substrate.

According to an exemplary embodiment of the present disclosure, the non-conductive adhesive layer comprises a die attach film or an adhesive glue.

According to an exemplary embodiment of the present disclosure, the electrical isolation layer is a molding layer or a spin-coated layer.

According to another aspect of the present disclosure, there is provided a semiconductor package, comprising: any semiconductor device as mentioned above; and a molding compound encapsulating the semiconductor device.

According to another aspect of the present disclosure, there is provided a method for manufacturing a semiconductor device, comprising: providing a semiconductor wafer; forming an electrical isolation layer on a surface of the semiconductor wafer; attaching a die attach film to the electrical isolation layer; dicing the semiconductor wafer, the electrical isolation layer, and the die attach film to form monolithic structures, each of the monolithic structure comprising a semiconductor die; and adhering the monolithic structure to the substrate via the die attach film, wherein the die attach film is disposed between the electrical isolation layer and the substrate.

According to an exemplary embodiment of the present disclosure, forming the electrical isolation layer on the surface of the semiconductor wager comprises: forming the electrical isolation layer on the surface of the semiconductor wafer using a molding or spin-coating process.

According to an exemplary embodiment of the present disclosure, the method further comprises: adhering a further semiconductor die to the substrate using a conductive adhesive layer.

According to an exemplary embodiment of the present disclosure, the semiconductor die comprises a bonding pad, the bonding pad being disposed at another surface of the semiconductor die opposite to the surface, and wherein the method further comprises: providing a lead; and connecting the lead to the bonding pad via a bonding wire.

According to an exemplary embodiment of the present disclosure, the method further comprises: encapsulating using a molding compound to form a package.

According to yet another aspect of the present disclosure, there is provided a method for manufacturing a semiconductor device, comprising: providing a semiconductor wafer; forming an electrical isolation layer on a surface of the semiconductor wafer; dicing the semiconductor wafer and the electrical isolation layer to form monolithic structures, each of the monolithic structures comprising a semiconductor die; and adhering the monolithic structures to a substrate using an adhesive glue, wherein the adhesive glue is disposed between the electrical isolation layer and the substrate.

According to an exemplary embodiment of the present disclosure, forming the electrical isolation layer on the surface of the semiconductor wafer comprises: forming the electrical isolation layer on the surface of the semiconductor wafer using a molding or spin-coating process.

According to an exemplary embodiment of the present disclosure, the method further comprises: adhering a further semiconductor die to the substrate using a conductive adhesive layer.

According to an exemplary embodiment of the present disclosure, the semiconductor die comprises a bonding pad, the bonding pad being disposed at another surface of the semiconductor die opposite to the surface, and wherein the method further comprises: providing a lead; and connecting the lead to the bonding pad via a bonding wire.

According to an exemplary embodiment of the present disclosure, the method further comprises: encapsulating using a molding compound to form a package.

In the technical solutions of various embodiments of the present disclosure, since an electrical isolation layer is used to provide electrical isolation between the semiconductor die and the substrate, a risk of a short circuit between the semiconductor die and the substrate is reduced, thereby enhancing the reliability of the electric isolation between the semiconductor die and the substrate. Besides, because the electrical isolation layer is relatively stable, resonance may be avoided when mounting a bonding wire using thermal ultrasonic techniques, thereby enhancing the connection stability of the semiconductor die and the lead to the bonding wire.

BRIEF DESCRIPTION OF THE SEVERAL VIEWS OF THE DRAWINGS

The above and other objectives, features and advantages will become obvious when reading the following detailed description of the illustrative embodiments with reference to the accompanying drawings. In these figures.

DETAILED DESCRIPTION

Hereinafter, the principle and spirit of the present disclosure will be described with reference to several exemplary embodiments shown in the figures. It should be understood that these embodiments are described only for enabling those skilled in the art to better understand and then further implement the present disclosure, not intended to limit the scope of the present invention in any manner.

Figure 1:
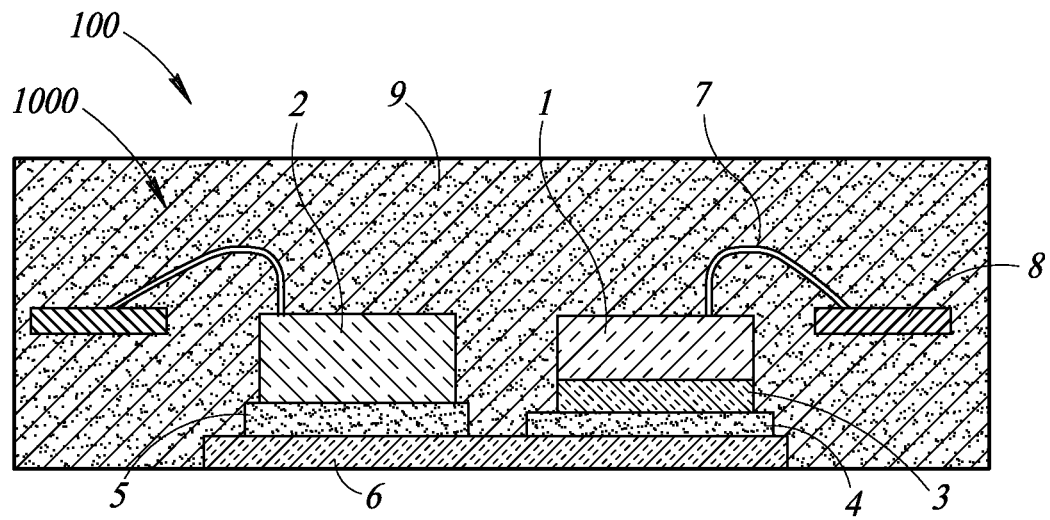
FIG. 1 illustrates a semiconductor package comprising a semiconductor device according to the prior art.
Figure 2:
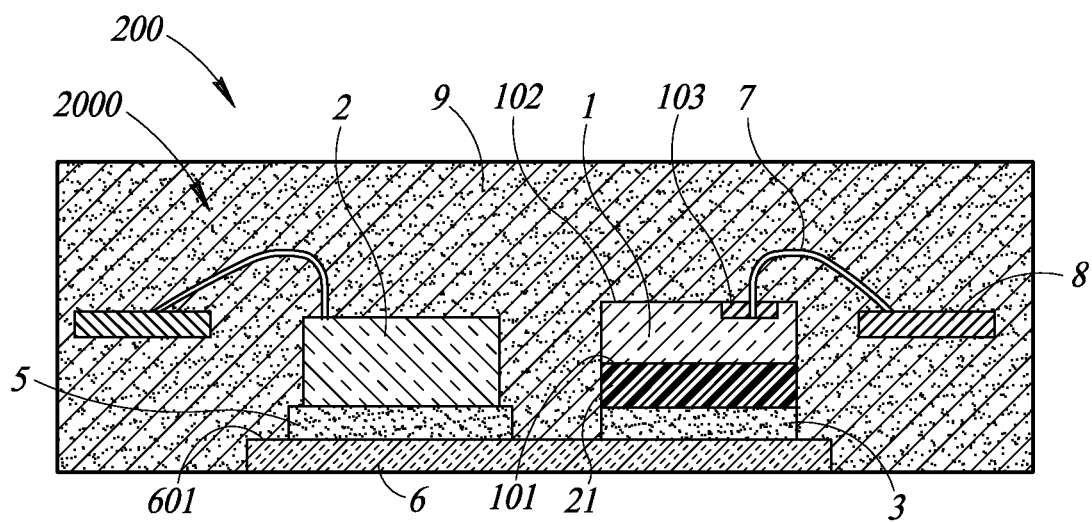
FIG. 2 illustrates a semiconductor package comprising a semiconductor device according to an embodiment of the present disclosure.

FIG. 2 shows a semiconductor package 200 comprising a semiconductor device 2000 according to an embodiment of the present disclosure. As shown in FIG. 2, the semiconductor package 200 may comprise a semiconductor device 2000 and a molding compound 9 for encapsulating the semiconductor device 2000. The molding compound 9 can provide a stable and reliable working environment for the semiconductor device 2000, and the molding compound 9 may comprise various types of package materials, e.g., epoxy resin.

As shown in FIG. 2, the semiconductor device 2000 may comprise two semiconductor dice (i.e., a first semiconductor die 1 and a semiconductor die 2) mounted to the same surface 601 of the substrate 6. The substrate 6 may be used to provide a support for the first semiconductor die 1 and the second semiconductor die 2 mounted thereon. In the semiconductor device 2000, the first semiconductor die 1 may be electrically isolated from the substrate 6, while the second semiconductor die 2 may be electrically connected to the substrate 6.

As shown in FIG. 2, the first semiconductor die 1 may comprise a first surface 101, a second surface 102 opposite to the first surface 101, and a bonding pad 103 disposed at the second surface 102 and configured to provide a connection to an external circuit. In the embodiment shown in FIG. 2, the semiconductor device 2000 may also comprise an electrical isolation layer 21 on the first surface 101 of the first semiconductor die 1. The electrical isolation layer 21 may be a molded layer (e.g., a plastic layer) formed on the first surface 101 using a molding process. The electrical isolation layer may also be a spin-coated layer (e.g., a polymer material layer) formed on the first surface 101 using a spin-coating process. Of course, the electrical isolation layer 21 may also be a hard material layer formed using other processing (e.g., depositing), not limited to the hard material layers mentioned above. A particular feature of the present disclosure is that the electrical isolation layer may be formed from physically hard materials, including a plastic sheet, a molding compound (e.g., a fully-cured polyimide layer). The hard, electrical isolation layer 21 directly abuts the semiconductor die 1. The hardness of the electrical isolation layer 21 may have a value on the Rockwell hardness E scale that is in the range of 52-99 or in the range of 69-120, for example. In one embodiment, the electrical isolation layer 21 is formed from Hysol, which is available from Henkel Adhesives.

As shown in FIG. 2, the semiconductor device 2000 may further comprise a DAF 3 disposed between the electrical isolation layer 21 and the substrate 6 so as to adhere the electrical isolation layer 21 onto a surface 601 of the substrate 6.

As shown in FIG. 2, the semiconductor device 2000 may further comprise a conductive adhesive layer 5 disposed between the second semiconductor die 2 and the substrate 6. The conductive adhesive layer 5 is used for adhering the second semiconductor die 2 to the surface 601 of the substrate 6 and providing an electrical connection between the second semiconductor die 2 and the substrate 6.

Besides, the semiconductor die 2000 may further comprise a bonding wire 7 and a lead 8. The bonding wire 7 is used for connecting the bonding pad 103 to the lead 8 so as to provide an electrical connection to an external circuit. In a similar manner, the second die 2 may also be provided with a bonding pad, and the bonding pad is connected to a lead via a bonding wire, so as to provide an electrical connection to an external circuit.

Although a specific semiconductor device 2000 has been described above with reference to FIG. 2, those skilled in the art should understand that the semiconductor device 2000 may assume other forms, e.g., it may only comprise a portion of the semiconductor device 2000 shown in FIG. 2. For example, in some embodiments, the semiconductor device 2000 comprises only a first semiconductor die 1, an electrical isolation layer 21, a DAF 3, and a substrate 6.

In the embodiment shown in FIG. 2, because an electrical isolation layer 21 is used to provide electrical isolation between the first semiconductor die 1 and the substrate 6, the risk of a short circuit between the first semiconductor die 1 and the substrate 6 is reduced, thereby enhancing the reliability of electric isolation between the semiconductor die 1 and the substrate 6. Besides, because the electrical isolation layer 21 is relatively stable, resonance can be avoided when mounting the bonding wire 7 using thermal ultrasonic techniques, thereby enhancing the connection stability between the bonding wire 7 and the lead 8 and the bonding pad 103 of the first semiconductor die 1.

FIGS. 3A-3F illustrate a process of manufacturing a semiconductor package 200 shown in FIG. 2. Hereinafter, a manufacturing process of the semiconductor package 200 as shown in FIG. 2 will be described in detail with reference to FIGS. 3A-3F.

Figure 3A:
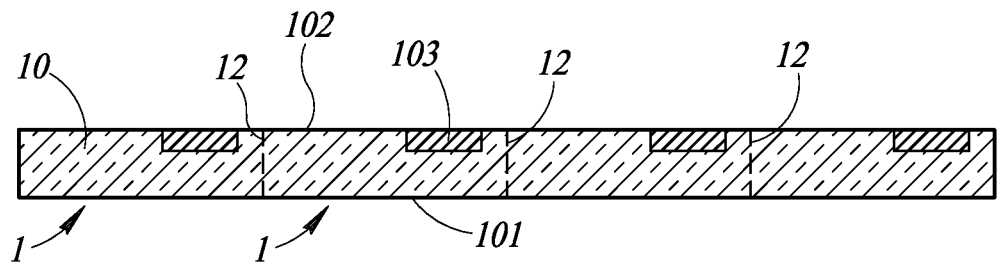
FIGS. 3A-3F illustrate a process of manufacturing a semiconductor package shown in FIG. 2.

As shown in FIG. 3A, there is provided a semiconductor wafer 10 comprising a plurality of semiconductor dice. The semiconductor wafer 10 may comprise a first surface 101, a second surface 102 opposite to the first surface 101, and a bonding pad 103 disposed at the second surface 102. The semiconductor wafer 10 will be cut at the dashed lines 12 to obtain a plurality of monolithic structures, each of which includes a semiconductor die 1, an electrical isolation layer 21, and a DAF 3, as explained herein.

Figure 3B:
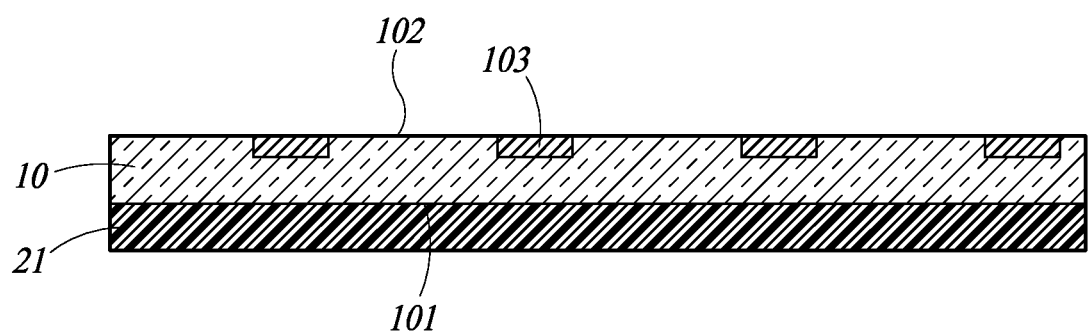

As shown in FIG. 3B, an electrical isolation layer 21 is formed on the first surface 101 of the semiconductor wafer 10. In some embodiments, the electrical isolation layer 21 (e.g., plastic layer) may be formed on the first surface 101 of the semiconductor wafer 10 using a molding process. In other embodiments, the electrical isolation layer 21 (e.g., a polymer material layer) may be formed on the first surface 101 of the semiconductor wafer 10 using a spin-coating process. In other embodiments, the electrical isolation layer 21 may be formed on the first surface 101 of the semiconductor wafer 10 using other processing (e.g., depositing).

Figure 3C:
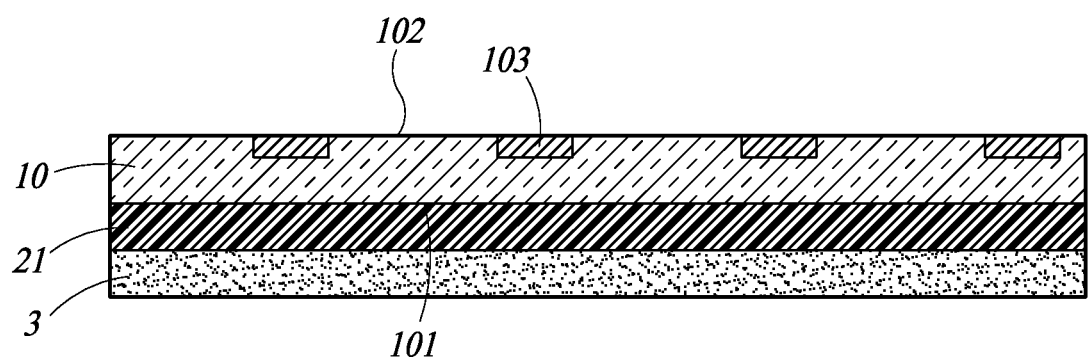

As shown in FIG. 3C, the DAF 3 is attached onto the electrical isolation layer 21.

Figure 3D:
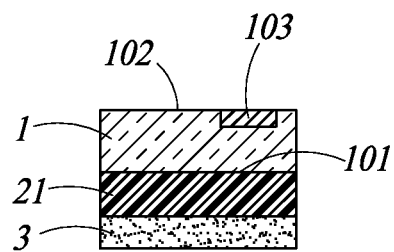

As shown in FIG. 3D, the semiconductor wafer 10, electrical isolation layer 21, and DAF 3 are diced to form monolithic structures, each of the monolithic structures including a semiconductor die 1. Correspondingly, the semiconductor die 1 comprises a first surface 101, a second surface 102 opposite to the first surface 101, and a bonding pad 103 disposed at the second surface 102.

Figure 3E:
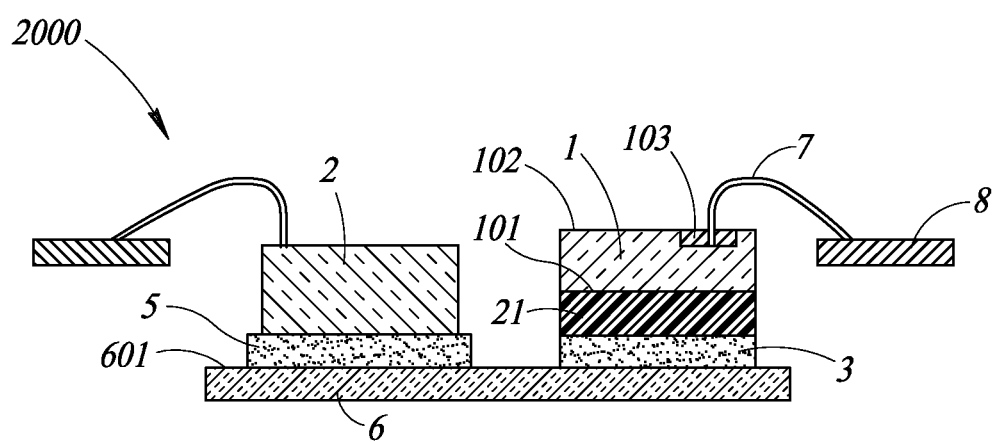

As shown in FIG. 3E, the monolithic structure as shown in FIG. 3D is adhered to the surface 601 of the substrate 6 using the DAF 3, such that the DAF 3 is located between the electrical isolation layer 21 and the substrate 6. Besides, in this step, a bonding pad 103 disposed at the second surface 102 of the semiconductor die 1 is connected to the lead 8 using the bonding wire 7. In this step, besides mounting the second semiconductor die 1, a further semiconductor die 2 may also be mounted. For example, the further semiconductor die 2 may be adhered onto the surface 601 of the substrate 6 via a conductive adhesive layer 5. Similarly, the further semiconductor die 2 may also be connected to the corresponding lead using the bonding wire.

Figure 3F:
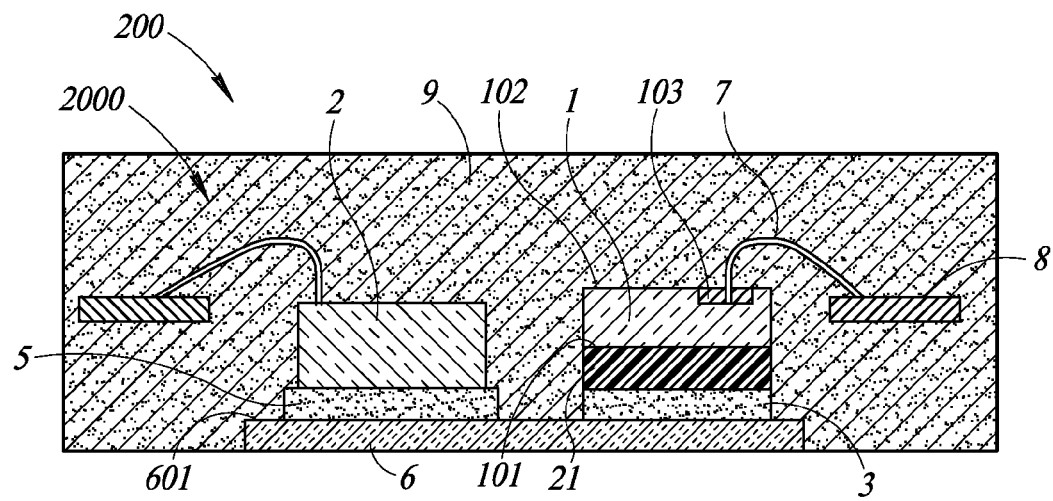

As shown in FIG. 3F, the semiconductor device 2000 is encapsulated using the molding compound 9 to form a package 200. The molding compound 9 can provide a stable and reliable working environment for the semiconductor device 2000, and the molding compound 9 may comprise various types of package materials, e.g., epoxy resin.

Through the above steps, a semiconductor device 2000 is derived, and the semiconductor package 200 is also derived.

Figure 4:
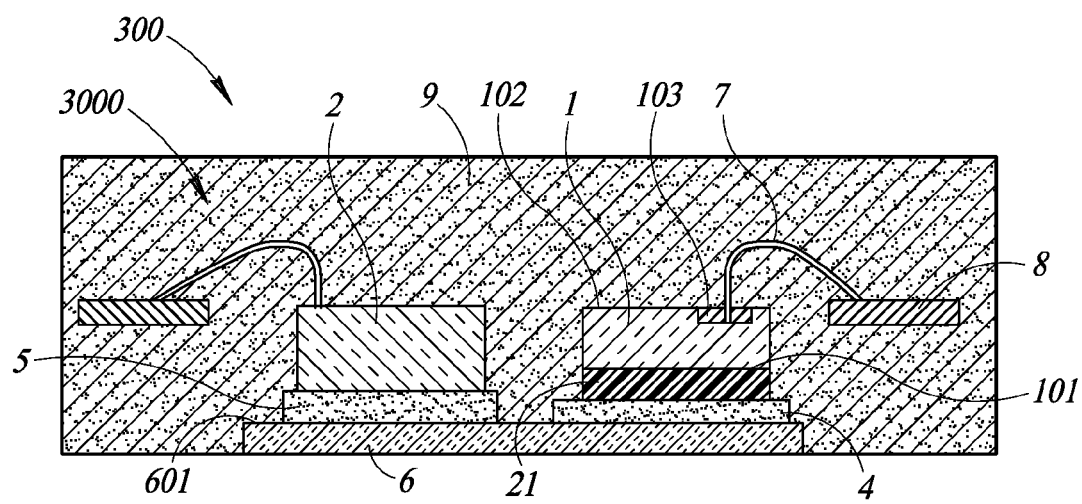
FIG. 4 illustrates a semiconductor package comprising a semiconductor device according to a further embodiment of the present disclosure.

FIG. 4 shows a semiconductor package 300 comprising a semiconductor 3000 according to another embodiment of the present disclosure. The semiconductor package 300 is similar to the semiconductor package 200 shown in FIG. 2. The semiconductor device 3000 comprised in the semiconductor package 300 is similar to the semiconductor device 2000 comprised in the semiconductor package 200 as shown in FIG. 2. Therefore, identical parts will not be described, and only the difference between the semiconductor device 3000 and the semiconductor device 2000 is illustrated.

In the semiconductor device 3000, instead of DAF 3, the electrical isolation layer 21 is adhered to the substrate 6 using the adhesive glue 4. Because the price of DAF 3 is high, the cost of the semiconductor device 3000 is further reduced due to replacing DAF 3 with adhesive glue 4 in the present embodiment.

FIGS. 5A-5E illustrate a process of manufacturing the semiconductor package 300 as shown in FIG. 4. Hereinafter, the manufacturing process of the semiconductor package 300 as shown in FIG. 4 will be described in detail with reference to FIGS. 5A-5E.

Figure 5A:
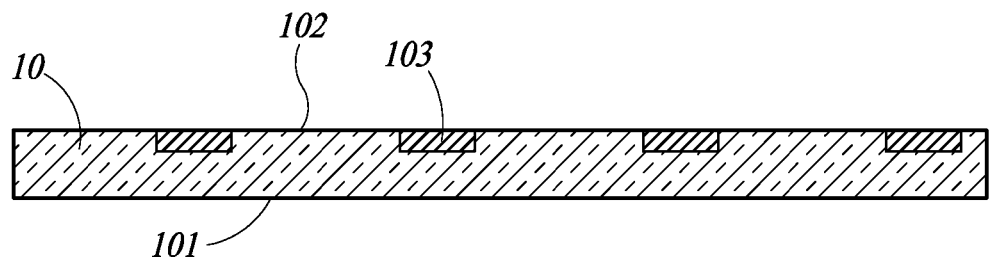
FIGS. 5A-5E illustrate a process of manufacturing a semiconductor package shown in FIG. 4.

As shown in FIG. 5A, there is provided a semiconductor wafer 10 comprising a plurality of semiconductor dice. The semiconductor wafer 10 may comprise a first surface 101, a second surface opposite to the first surface 101, and a bonding pad 103 disposed at the second surface 102.

Figure 5B:
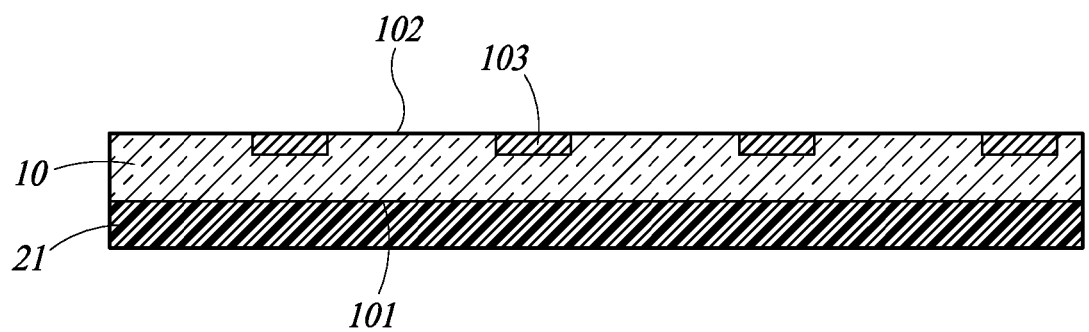

As shown in FIG. 5B, an electrical isolation layer 21 is formed on the first surface 101 of the semiconductor wafer 10. In some embodiments, the electrical isolation layer 21 (e.g., a plastic layer) may be formed on the first surface 101 of the semiconductor wafer 10 using a molding process. In some other embodiments, the electrical isolation layer 21 (e.g., a polymer material layer) may be formed on the first surface 101 of the semiconductor wafer 10 using a spin-coating process. In other embodiments, the electrical isolation layer 21 may be formed on the first surface 101 of the semiconductor wafer 10 using other processing (e.g., depositing).

Figure 5C:
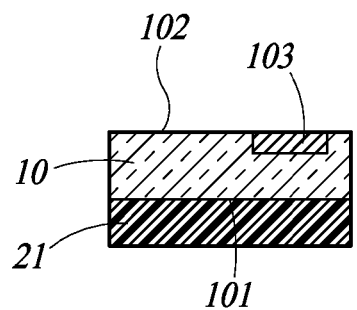

As shown in FIG. 5C, the semiconductor wafer 10 and the electrical isolation layer 21 are cut to form monolithic structures, each of the monolithic structures comprising a semiconductor die 1. Correspondingly, the semiconductor die 1 comprises a first surface 101, a second surface 102 opposite to the first surface 101, and a bonding pad 103 disposed at the second surface 102.

Figure 5D:
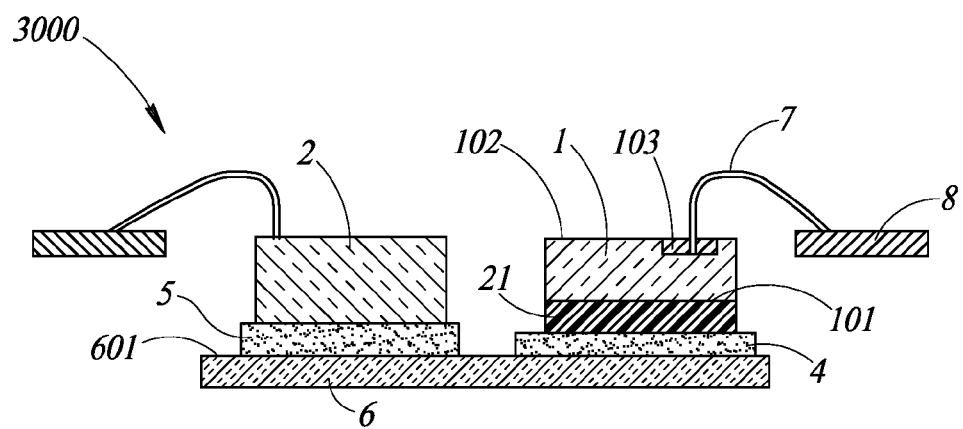

As shown in FIG. 5D, the monolithic structure shown in FIG. 5C is adhered onto a surface 601 of a substrate 6 using an adhesive glue 4, such that the adhesive glue 4 is disposed between the electrical isolation layer 21 and the substrate 6. Besides, in this step, the bonding pad 103 disposed at the second surface 102 of the semiconductor die 1 may also be connected to the lead 8 via the bonding wire 7. In this step, besides mounting the semiconductor die 1, a further semiconductor die 2 may also be mounted. For example, the further semiconductor die 2 may be adhered to the surface 601 of the substrate 6 using a conductive adhesive layer 5. Similarly, the further semiconductor die 2 may also be connected to a corresponding lead via the bonding wire.

Figure 5E:
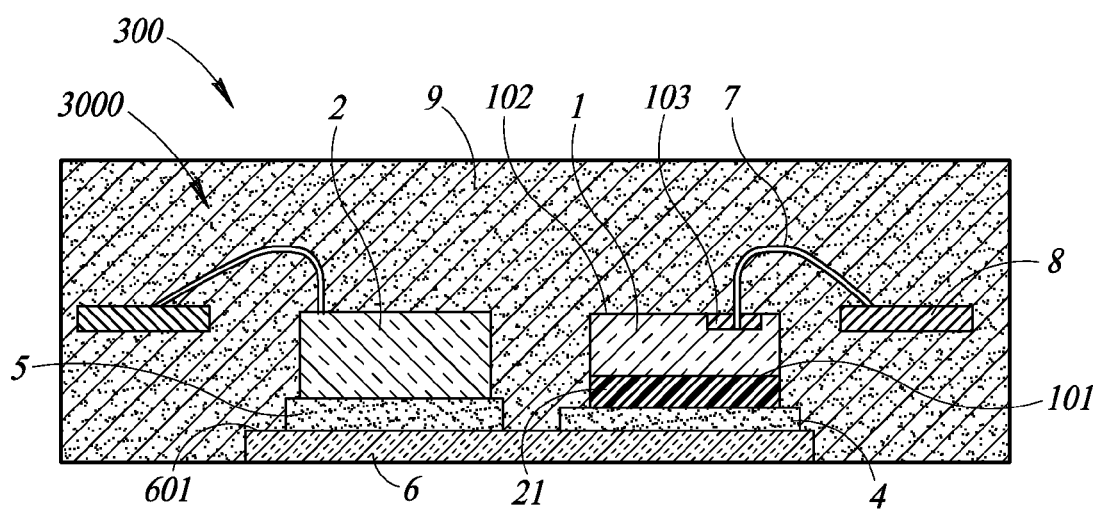

As shown in FIG. 5E, the semiconductor device 3000 is encapsulated using a molding compound 9 to form a package 300. The molding compound 9 may provide a stable and reliable working environment for the semiconductor device 3000, and the molding compound 9 may comprise various types of package materials, e.g., epoxy.

Through the above steps, a semiconductor device 3000 is derived, and a semiconductor package 300 is also derived.

The description of the present disclosure has been provided for the illustrative and descriptive purposes. However, it is not intended to exhaust or limit the invention in the disclosed forms. Those skilled in the art may conceive of various amendments and variants. Therefore, the embodiments are selected and described only for better illustrating the principle and practical application of the present disclosure and for enabling other persons skilled in the art to understand the following content, namely, without departing from the spirit of the present disclosure, all modifications and replacements will fall within the protection scope of the present disclosure as defined in the appended claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor device, comprising:
a semiconductor die;
an electrical isolation layer formed on a surface of the semiconductor die, the electrical isolation layer abutting the semiconductor die and having a Rockwell hardness E scale value of at least 52;
a substrate; and
a non-conductive adhesive layer disposed between the electrical isolation layer and the substrate, so as to adhere the electrical isolation layer to the substrate, the electrical isolation layer being harder than the adhesive layer.

2. The semiconductor device according to claim 1, wherein the semiconductor die comprises a bonding pad, the bonding pad being disposed at another surface of the semiconductor die opposite to the surface.

3. The semiconductor device according to claim 2, further comprising a lead, the lead being connected to the bonding pad using a bonding wire.

4. The semiconductor device according to claim 1, further comprising:
a further semiconductor die; and
a conductive adhesive layer configured to adhere the further semiconductor die to the substrate.

5. The semiconductor device according to claim 1, wherein the non-conductive adhesive layer comprises a die attach film or an adhesive glue.

6. The semiconductor device according to claim 1, wherein the electrical isolation layer is a molding layer or a spin-coated layer.

7. The semiconductor device according to claim 1 wherein a molding compound encapsulates the semiconductor device to form a semiconductor package.

8. The semiconductor device according to claim 1, wherein the electrical isolation layer has a Rockwell hardness E scale value in a range of 52-99.

9. The semiconductor device according to claim 1, the electrical isolation layer has a Rockwell hardness E scale value in a range of 69-120.

10. The semiconductor device according to claim 1, wherein the electrical isolation layer is formed from a plastic sheet.

* * * * *